United States Patent
Pavlopoulos et al.

(10) Patent No.: US 11,621,270 B2
(45) Date of Patent: Apr. 4, 2023

(54) METHODS OF FORMING AN ARRAY OF ELEVATIONALLY-EXTENDING STRINGS OF MEMORY CELLS, METHODS OF FORMING POLYSILICON, ELEVATIONALLY-EXTENDING STRINGS OF MEMORY CELLS INDIVIDUALLY COMPRISING A PROGRAMMABLE CHARGE STORAGE TRANSISTOR, AND ELECTRONIC COMPONENTS COMPRISING POLYSILICON

(71) Applicant: Micron Technology, Inc., Boise, ID (US)

(72) Inventors: Dimitrios Pavlopoulos, Boise, ID (US); Kunal Shrotri, Boise, ID (US); Anish A. Khandekar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/385,201

(22) Filed: Jul. 26, 2021

(65) Prior Publication Data

US 2021/0351197 A1 Nov. 11, 2021

Related U.S. Application Data

(62) Division of application No. 16/518,498, filed on Jul. 22, 2019, now Pat. No. 11,094,705, which is a (Continued)

(51) Int. Cl.
*H01L 27/11568* (2017.01)
*H01L 27/11519* (2017.01)
(Continued)

(52) U.S. Cl.
CPC .... *H01L 27/11568* (2013.01); *H01L 27/1157* (2013.01); *H01L 27/11519* (2013.01);
(Continued)

(58) Field of Classification Search
CPC ..... H01L 21/823412; H01L 21/823807; H01L 29/66522; H01L 29/20–2006; H01L 29/16–1608; H01L 29/22–2206; H01L 29/66068; H01L 29/1037; H01L 29/1041–105; H01L 29/1054; H01L 29/7842–7849; H01L 29/66636;
(Continued)

(56) References Cited

U.S. PATENT DOCUMENTS

6,787,807 B2 9/2004 Yamazaki et al.
7,119,016 B2 10/2006 Chakravarti et al.
(Continued)

*Primary Examiner* — Sonya McCall-Shepard
(74) *Attorney, Agent, or Firm* — Wells St. John P.S.

(57) ABSTRACT

A method of forming polysilicon comprises forming a first polysilicon-comprising material over a substrate, with the first polysilicon-comprising material comprising at least one of elemental carbon and elemental nitrogen at a total of 0.1 to 20 atomic percent. A second polysilicon-comprising material is formed over the first polysilicon-comprising material. The second polysilicon-comprising material comprises less, if any, total elemental carbon and elemental nitrogen than the first polysilicon-comprising material. Other aspects and embodiments, including structure independent of method of manufacture, are disclosed.

9 Claims, 4 Drawing Sheets

Related U.S. Application Data division of application No. 16/002,075, filed on Jun. 7, 2018, now Pat. No. 10,381,367, which is a division of application No. 15/295,577, filed on Oct. 17, 2016, now Pat. No. 10,014,311.

(51) Int. Cl.

| | | |
|---|---|---|
| *H01L 27/11521* | (2017.01) | |
| *H01L 27/11556* | (2017.01) | |
| *H01L 27/11565* | (2017.01) | |
| *H01L 27/1157* | (2017.01) | |
| *H01L 27/11582* | (2017.01) | |
| *H01L 29/04* | (2006.01) | |
| *H01L 29/66* | (2006.01) | |
| *H01L 29/788* | (2006.01) | |
| *H01L 29/792* | (2006.01) | |

(52) U.S. Cl.
CPC .. *H01L 27/11521* (2013.01); *H01L 27/11556* (2013.01); *H01L 27/11565* (2013.01); *H01L 27/11582* (2013.01); *H01L 29/04* (2013.01); *H01L 29/045* (2013.01); *H01L 29/66825* (2013.01); *H01L 29/66833* (2013.01); *H01L 29/788* (2013.01); *H01L 29/792* (2013.01)

(58) Field of Classification Search
CPC ............. H01L 29/7843; H01L 29/7847; H01L 29/7725; H01L 27/11568; H01L 27/11521; H01L 27/11519; H01L 27/11565; H01L 27/11556; H01L 27/11582; H01L 29/04; H01L 29/045; H01L 27/1157; H01L 29/66825; H01L 29/66833; H01L 29/788; H01L 29/792

See application file for complete search history.

(56) References Cited

U.S. PATENT DOCUMENTS

| | | | |
|---|---|---|---|
| 7,898,850 | B2 | 3/2011 | Min et al. |
| 8,008,722 | B2 | 8/2011 | Kim et al. |
| 9,287,290 | B1 | 3/2016 | Rabkin et al. |
| 9,478,495 | B1 * | 10/2016 | Pachamuthu ..... H01L 27/11568 |
| 2009/0121288 | A1 * | 5/2009 | Patruno ............ H01L 29/66795 438/479 |
| 2011/0001181 | A1 | 1/2011 | Ju et al. |
| 2012/0248399 | A1 | 10/2012 | Sasago et al. |
| 2013/0234096 | A1 | 9/2013 | Sekine et al. |
| 2013/0270631 | A1 | 10/2013 | Kim et al. |
| 2014/0073099 | A1 | 3/2014 | Park et al. |
| 2016/0035741 | A1 | 2/2016 | Tajima et al. |
| 2016/0099250 | A1 | 4/2016 | Rabkin et al. |
| 2017/0033175 | A1 | 2/2017 | Oda et al. |
| 2017/0084478 | A1 * | 3/2017 | Nguyen ............ H01L 21/76254 |
| 2018/0330983 | A1 | 11/2018 | Wang et al. |

* cited by examiner

FIG. 6B

METHODS OF FORMING AN ARRAY OF ELEVATIONALLY-EXTENDING STRINGS OF MEMORY CELLS, METHODS OF FORMING POLYSILICON, ELEVATIONALLY-EXTENDING STRINGS OF MEMORY CELLS INDIVIDUALLY COMPRISING A PROGRAMMABLE CHARGE STORAGE TRANSISTOR, AND ELECTRONIC COMPONENTS COMPRISING POLYSILICON

RELATED PATENT DATA

This patent resulted from a divisional application of U.S. patent Ser. No. 16/518,498, filed Jul. 22, 2019, entitled "Methods Of Forming An Array Of Elevationally-Extending Strings Of Memory Cells, Methods Of Forming Polysilicon, Elevationally-Extending Strings Of Memory Cells Individually Comprising A Programmable Charge Storage Transistor, And Electronic Components Comprising Polysilicon", naming Dimitrios Pavlopoulos, Kunal Shrotri, and Anish A. Khandekar as inventors, which was a divisional application of U.S. patent application Ser. No. 16/002,075, filed Jun. 7, 2018, entitled "Methods Of Forming An Array Of Elevationally-Extending Strings Of Memory Cells, Methods Of Forming Polysilicon, Elevationally-Extending Strings Of Memory Cells Individually Comprising A Programmable Charge Storage Transistor, And Electronic Components Comprising Polysilicon", naming Dimitrios Pavlopoulos, Kunal Shrotri, and Anish A. Khandekar as inventors, now U.S. Pat. No. 10,381,367, which was a divisional application of U.S. patent application Ser. No. 15/295,577, filed Oct. 17, 2016, entitled "Methods Of Forming An Array Of Elevationally-Extending Strings Of Memory Cells, Methods Of Forming Polysilicon, Elevationally-Extending Strings Of Memory Cells Individually Comprising A Programmable Charge Storage Transistor, And Electronic Components Comprising Polysilicon", naming Dimitrios Pavlopoulos, Kunal Shrotri, and Anish A. Khandekar as inventors, now U.S. Pat. No. 10,014,311, the disclosures of which are incorporated by reference.

TECHNICAL FIELD

Embodiments disclosed herein pertain to methods of forming an array of elevationally-extending strings of memory cells, to methods of forming polysilicon, to elevationally-extending strings of memory cells individually comprising a programmable charge storage transistor, and to electronic components comprising polysilicon.

BACKGROUND

Memory provides data storage for electronic systems. Flash memory is one type of memory, and has numerous uses in computers and other devices. For instance, personal computers may have BIOS stored on a flash memory chip. As another example, flash memory is used in solid state drives to replace spinning hard drives. As yet another example, flash memory is used in wireless electronic devices as it enables manufacturers to support new communication protocols as they become standardized, and to provide the ability to remotely upgrade the devices for improved or enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Memory cell strings in flash or other memory may be arranged to extend horizontally or vertically. Vertical memory cell strings reduce horizontal area of a substrate occupied by the memory cells in comparison to horizontally-extending memory cell strings, albeit typically at the expense of increased vertical thickness.

DETAILED DESCRIPTION OF EXAMPLE EMBODIMENTS

Embodiments of the invention include methods of forming polysilicon. Such method embodiments are described with respect to fabrication of an array of elevationally-extending strings of memory cells having polysilicon-comprising channels, although such polysilicon may be formed as part of any electronic component or of any construction that is not an electronic component. Embodiments of the invention also include elevationally-extending strings of memory cells independent of method of manufacture, with the memory cells individually comprising a programmable charge storage transistor. In this document, "elevationally-extending" and "extend(ing) elevationally" refer to a direction that is angled away by at least 45⁰ from a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further and unless otherwise indicated, "elevational(ly)", "higher", "upper", "lower", "top", "atop", "bottom", "above", "below", "under", "beneath", "up", and "down" are generally with reference to the vertical direction. Also, "elevationally-extending" and "extend(ing) elevationally" with respect to a field effect transistor are with reference to orientation of the transistor's channel length along which current flows in operation between the source/drain regions. Embodiments of the invention also include electronic components comprising polysilicon independent of method of manufacture.

Figure 1:
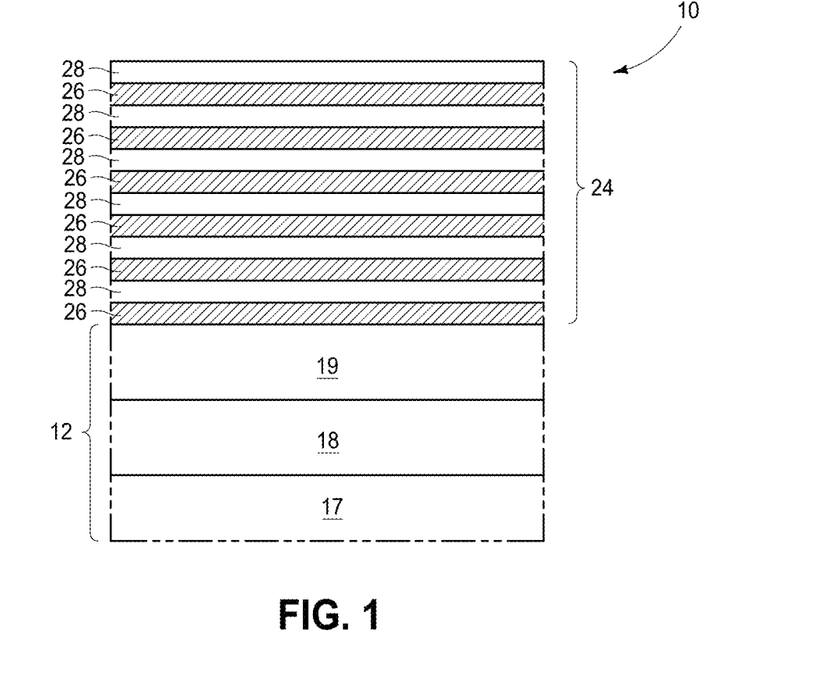
FIG. 1 is a diagrammatic sectional view of a substrate fragment in process in accordance with an embodiment of the invention.

Referring to FIG. 1, a substrate fragment or construction 10 may be considered as comprising a base substrate 12 that may include any one or more of conductive/conductor/conducting (i.e., electrically herein), semiconductive, or insulative/insulator/insulating (i.e., electrically herein) materials. Various materials are shown above base substrate 12. Materials may be aside, elevationally inward, or elevationally outward of the FIG. 1-depicted materials. For example, other partially or wholly fabricated components of integrated circuitry may be provided somewhere above, about, or within substrate 12. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Example substrate 12 comprises semiconductor material 17, for example monocrystalline silicon, having a conductively doped source material 19 formed there-over or therein and which may comprise a portion of circuitry for the elevationally-extending strings of memory cells being fabricated. An insulator 18 (e.g., doped or undoped silicon dioxide and/or silicon nitride) is shown elevationally between semiconductor material 17 and material 19. An example source material 19 is conductively doped polysilicon of 500 Angstroms thickness over an underlying tungsten silicide of 900 Angstroms thickness. An example thickness for insulator 18 is 2,000 to 5,000 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

A material stack 24 has been formed over substrate 12 and comprises vertically-alternating tiers of control gate material 26 and insulative material 28 (e.g., doped or undoped silicon dioxide and/or silicon nitride). Control gate material 26 is conductive, with an example being conductively doped polysilicon. Example thicknesses for each of materials 26 and 28 are 200 to 400 Angstroms, and such need not be of the same respective thicknesses or of the same thickness relative one another when materials 26 and 28 individually are of constant thickness. Material stack 24 is shown as having twelve vertically-alternating tiers, although fewer or likely many more (e.g., dozens, hundreds, etc.) may be formed. The top layer of material 28 of material stack 24 may be made thicker or thinner than shown or an alternate material provided there-over (not shown) where desired as an etch-stop or polish-stop for better assuring a planar horizontal substrate (if desired).

Figure 2:
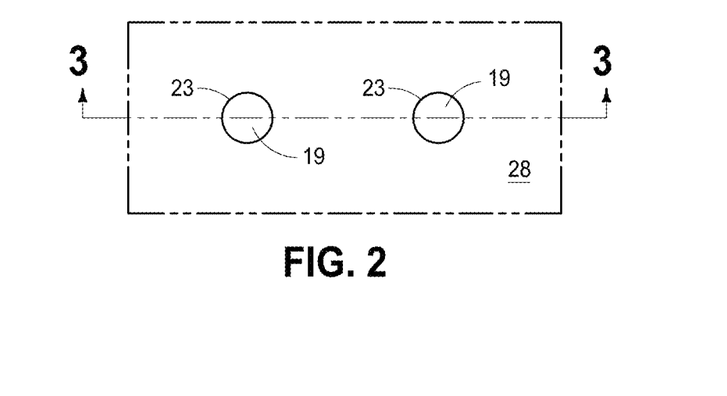
FIG. 2 is a diagrammatic top plan view of the FIG. 1 substrate at a processing step subsequent to that shown by FIG. 1.
Figure 3:
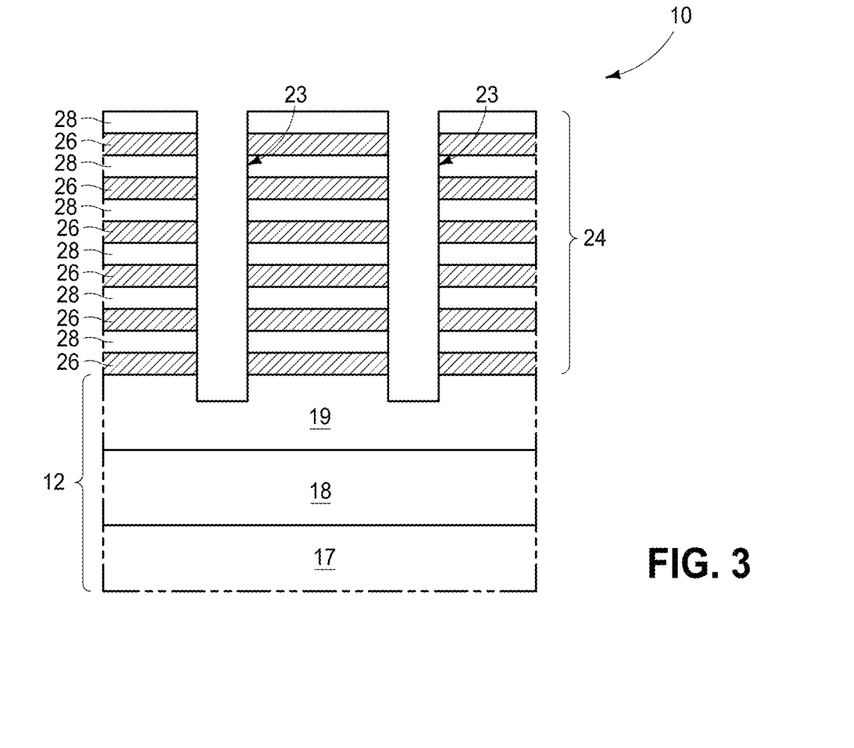
FIG. 3 is a view taken through line 3-3 in FIG. 2.

Referring to FIGS. 2 and 3, elevationally-extending channel openings 23 have been formed into vertically-alternating tiers of materials 26, 28. Only two such channel openings are formed, although likely hundreds, thousands, etc. would be formed for formation of hundreds, thousands, etc. of elevationally-extending strings of memory cells. Example techniques for forming channel openings 23 include dry anisotropic plasma etching using lithography with or without pitch multiplication (e.g., using photoresist and/or other imageable and/or non-imageable materials, including hard masking materials). Channel openings 23 may be circular, ellipsoidal, rectangular, or of other shape in horizontal cross-section, with circular being shown. In one embodiment and as shown, channel openings 23 extend completely through material 24 and partially into material 19. Channel openings 23 individually may have an example maximum horizontal open dimension of 850 to 1,250 Angstroms at their elevationally-outermost portions and which taper (not shown) to a horizontal open dimension of 5 percent to 10 percent less at their elevationally-innermost portions where meeting with source material 19. In one embodiment, channel openings 23 are formed to be vertical or within 10° vertical.

Polysilicon-comprising channel material is formed in the channel openings in a novel manner or manners in method embodiments as described below. Further, control gate material, control gate blocking insulator, programmable charge storage material, and tunnel insulator are ultimately provided operably proximate the polysilicon-comprising channel material either before or after forming such channel material.

Figure 4:
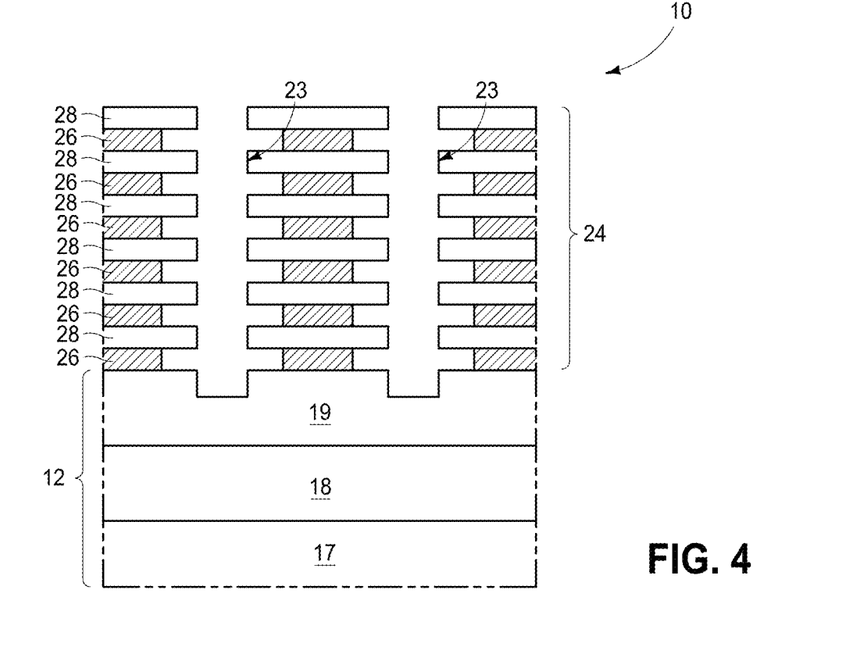
FIG. 4 is a view of the FIG. 3 substrate at a processing step subsequent to that shown by FIG. 3.

Referring to FIG. 4 and in one embodiment, control gate material 26 has been subjected an anisotropic wet etch to laterally recess it relative to the original sidewalls of channel opening 23. Such an etch may be conducted selectively relative to materials 28 and 19. In this document, a selective etch or removal is where one material is removed relative to another stated material at a rate of at least 2:1.

Figure 5:
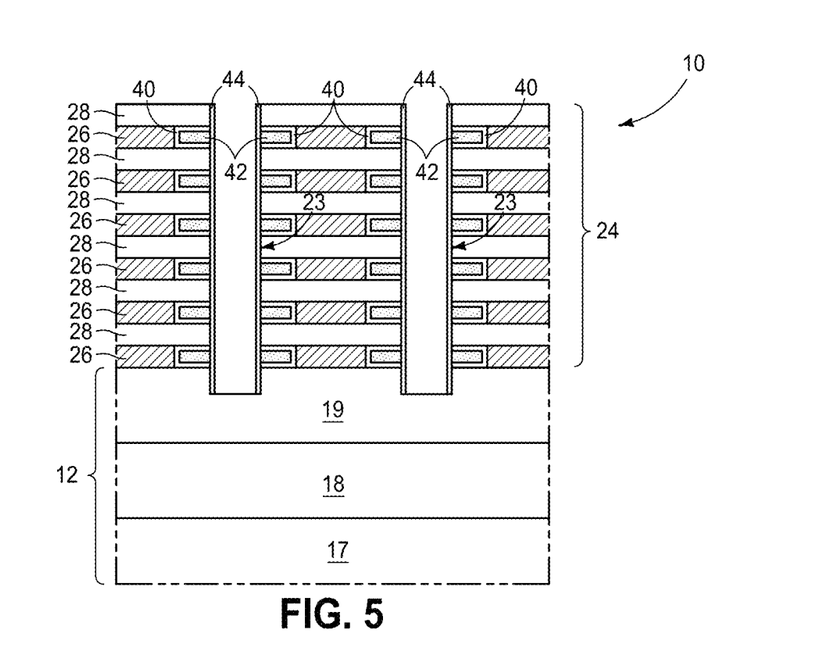
FIG. 5 is a view of the FIG. 4 substrate at a processing step subsequent to that shown by FIG. 4.

Referring to FIG. 5, several acts of processing have occurred relative to FIG. 4. Specifically, control gate blocking insulator 40 (e.g., one or more of silicon nitride, silicon dioxide, hafnium oxide, zirconium oxide, etc.), programmable charge storage material 42 (e.g., material suitable for utilization in floating gates or charge-trapping structures, such as, for example, one or more of silicon, silicon nitride, nanodots, etc.), and tunnel insulator 44 (e.g., one or more of silicon dioxide and silicon nitride) have been sequentially formed in channel openings 23. Such are shown as having been subjected to an etch (e.g., wet isotropic etch by exposure to one of HF and $H_3PO_4$ or by a dry anisotropic etch) to remove such from being substantially over horizontal surfaces before deposition of the next subsequent layer.

Alternately and by way of example only, such may be subjected to such etching after deposition of two or more such layers, where for example a goal is for a subsequently deposited channel material to electrically couple with source material 19.

Figure 6:
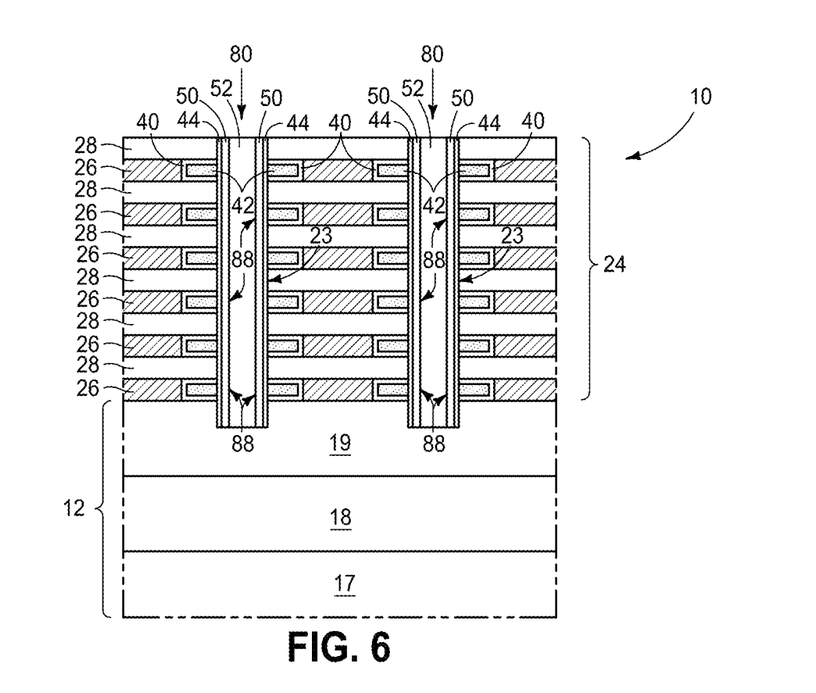
FIG. 6 is a view of the FIG. 5 substrate at a processing step subsequent to that shown by FIG. 5.

Referring to FIG. 6, polysilicon-comprising channel material 50 and a dielectric material 52 (e.g., silicon nitride and/or doped or undoped silicon dioxide) have been formed to fill remaining volume of channel openings 23, followed by planarizing materials 50 and 52 back at least to an elevationally-outermost surface of the elevationally-outermost material 28. Accordingly, polysilicon-comprising channel material 50 is shown as comprising a channel pillar in individual channel openings 23 in the form of a hollow channel pillar internally filled with dielectric material 52. Alternately, polysilicon-comprising channel material 50 may extend completely diametrically across channel openings 23 (e.g., no internal dielectric material 52 and not shown) thereby forming non-hollow channel pillars. Regardless, channel material 50 comprises doped polysilicon-comprising material having channel conductivity-modifying dopant(s) present in a quantity that produces intrinsic semiconductor properties enabling the channel material to operably function as switchable "on" and "off" channels for the individual memory cells for control gate voltage above and below, respectively, a suitable threshold voltage ($V_t$) depending on programming state of the charge storage transistor for the respective individual memory cell. An example such dopant quantity is $5 \times 10^{17}$ atoms/cm$^3$ to $5 \times 10^{18}$ atoms/cm$^3$. Polysilicon-comprising channel material 50 may be p-type or n-type.

Figure 6A:
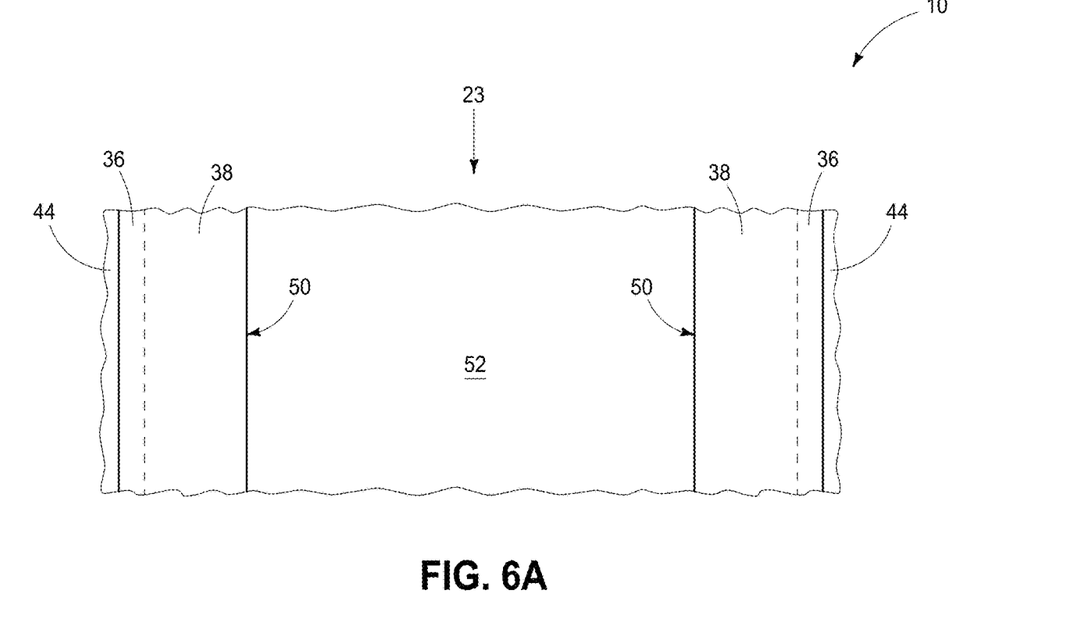
FIG. 6A is an enlargement of a portion of FIG. 6.

In accordance with method embodiments, polysilicon-comprising channel material 50 is formed in a novel manner, and which is described initially with reference to FIG. 6A which is an enlargement of a portion of tunnel insulator 44, polysilicon-comprising channel material 50, and dielectric material 52. Specifically, FIG. 6A shows formation of a first polysilicon-comprising material 36 in channel openings 23 and formation of a second polysilicon-comprising material 38 in channel openings 23 over first polysilicon-comprising material 36. In one embodiment and as shown, second polysilicon-comprising material 38 is formed directly against first polysilicon-comprising material 36. Regardless, first polysilicon-comprising material 36 is formed to comprise at least one of elemental carbon and elemental nitrogen at a total of 0.1 to 20 atomic percent, and in one embodiment from 0.5 to 2 atomic percent. In one embodiment, first polysilicon-comprising material 36 comprises both elemental carbon and elemental nitrogen. In one embodiment, first polysilicon-comprising material 36 comprises only one of elemental carbon and elemental nitrogen, in one such embodiment comprising elemental carbon and in another such embodiment comprising elemental nitrogen. Regardless, second polysilicon-comprising material 38 is formed to comprise less, if any, total elemental carbon and elemental nitrogen than first polysilicon-comprising material 36. In one embodiment, such total in the second polysilicon-comprising material is zero to 0.001 atomic percent.

Figure 6B:
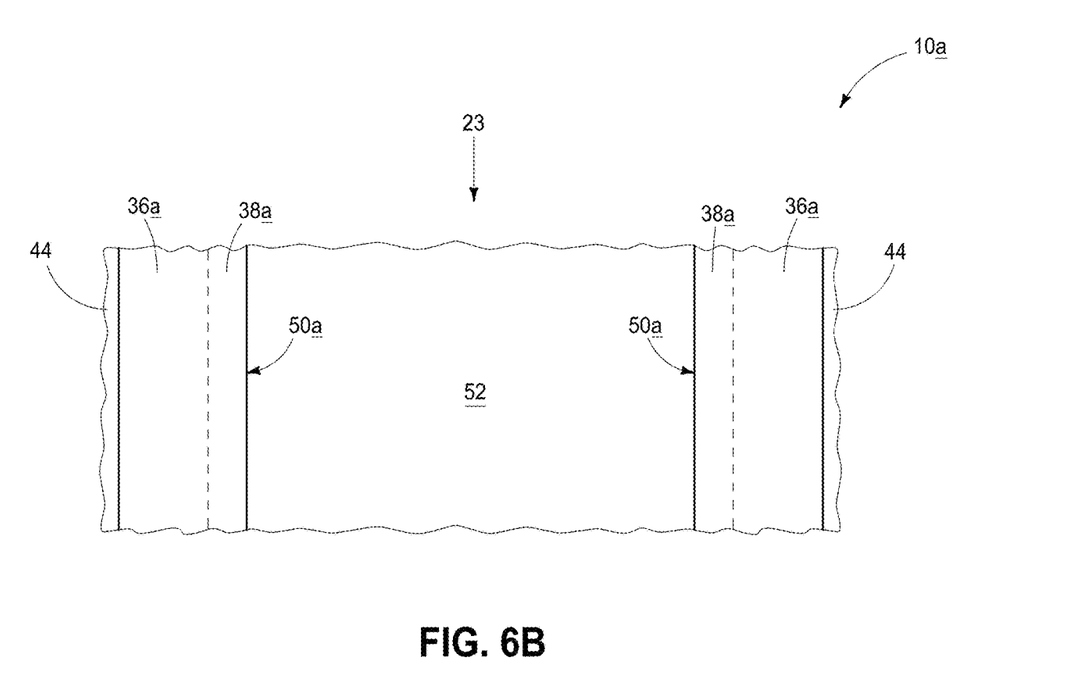
FIG. 6B is a diagrammatic sectional view of a substrate fragment in process in accordance with an embodiment of the invention, and is at the enlarged scale of FIG. 6A.

In one embodiment, first polysilicon-comprising material 36 is formed to a thickness that is 2 to 70 percent of the thickness of second polysilicon-comprising material 38, and in one embodiment to a thickness that is 2 to 30 percent of the thickness of second polysilicon-comprising material 38. FIG. 6A shows an embodiment wherein first polysilicon-comprising material 36 has been formed to be thinner than second polysilicon-comprising material 38. FIG. 6B shows an alternate embodiment construction 10a wherein first polysilicon-comprising material 36a has been formed to be thicker than second polysilicon-comprising material 38a in a polysilicon-comprising channel material 50a. Like numerals from the above-described embodiments have been used, with differences being indicated with the suffix "a". Any other attribute(s) or aspect(s) as shown and/or described above may be used.

By ways of examples only, polysilicon-comprising materials 36/36a and 38/38a can be formed by any suitable existing or yet-to-be-developed manners, such as ALD, CVD, LPCVD, and/or PECVD. In one ideal embodiment, second polysilicon-comprising material 38/38a is formed in situ in the same deposition chamber as first polysilicon-comprising material 36/36a and immediately thereafter. Regardless, example silicon-containing precursors for materials 36/36a and 38/38a are any silane and silicon tetrachloride. Example precursors for carbon atoms are any suitable hydrocarbon(s), and example precursors for nitrogen atoms are any one or more of $NH_3$, $N_2O$, NO, and $N_2$. Example volumetric flow rate for each (when greater than zero) is 0.1 to 1,000 sccm. Example substrate temperature is 250° C. to 1,000° C., example chamber pressure is 1 mTorr to room atmospheric, and example power is 0 to 7,000 Watts. An inert gas may additionally be provided to the deposition chamber at 0 sccm to 1 slm.

In one embodiment, first polysilicon-comprising material 36/36a and second polysilicon-comprising material 38/38a are formed to have at least 30 percent 11 crystal orientation (as measured by electron backscatter diffraction [EBSD]), and in one embodiment at least 50 percent 111 crystal orientation as measured by EBSD. Such may not result upon initial formation of channel material 50/50a, and may result thereafter from being exposed to suitable annealing conditions. For example, channel material 50/50a as initially formed may be amorphous or partially crystalline. Example annealing conditions are substrate temperature of 500° C. to 1,000° C., chamber pressure of 1 mTorr to room atmospheric, an inert or $H_2$ atmosphere, and time of such annealing from 15 nanoseconds to 48 hours.

Polycrystalline silicon (i.e., polysilicon) as-formed upon crystallization anneal has multiple individual crystal grains forming grain boundaries between immediately-adjacent grains. Individual grains include a large number of individual crystal unit cells that are typically of one of varying different Miller indices. Typically within an individual crystal grain, there is a uniformity of unit cells of the same Miller index crystal orientation. For example, typical polysilicon upon crystallization anneal overall has about 25 percent grains containing 111 orientation, 15 percent grains containing 220 orientation, 7 to 10 percent having 311 orientation, with the remainder each individually being of a different orientation of less than 7 percent each, and totaling 50 to 53 of the whole (each as measured by EBSD).

Maximizing of the 111 orientation is desired or ideal as such results in the greatest conductivity for a given concentration of conductivity-enhancing dopant in the polysilicon. Such results from the 111 crystal lattice inherently aligning perpendicular to the immediately-adjacent surface over which such material is formed, and which is typically orthogonal to current flow through the polysilicon. Additionally for maximizing conductivity in conductively-doped polysilicon, larger grains produce higher electrical conductivity than smaller grains. Fabricating of a polysilicon material as described herein with at least the stated first and second polysilicon-comprising materials may achieve greater than 50 percent 111 crystal grains as measured by EBSD, and can result in a crystal grain size that is 2 to 5 times as great in average diameter in comparison to polysilicon deposition and anneal in the absence of providing the stated first and second polysilicon-comprising materials.

FIG. 6 shows formation of elevationally-extending strings 80 of individual memory cells 88. Construction 10 is shown as comprising a single memory cell 88 about the channel pillar in each tier of the elevationally-extending strings of memory cells. Alternately, and by way of example only, any existing or yet-to-be-developed construction may be used wherein two or more memory cells are circumferentially spaced about the channel pillar in a single tier in a given string (not shown). Regardless, example memory cells 88 comprise a programmable charge storage transistor comprising materials 50, 44, 42, 40, and 26, and in one embodiment as shown extend elevationally.

The above-described processing was by way of example with respect to so-called "gate first" processing in comparison to so-called "gate last" or "replacement gate" processing. Accordingly and in one embodiment, the vertically-alternating tiers are formed to be vertically-alternating insulating material and control gate material prior to forming the channel openings. However, gate last/replacement gate processing may be used whereby a FIG. 1-starting-construction may be with a material 24 comprising alternating tiers of different composition insulating materials (i.e., no control gate material 26 yet) with one of such insulating materials being replaced with control gate material 26 after forming the control gate blocking insulator, the programmable charge storage material, the tunnel insulator, and the channel material in channel openings 23. Accordingly and in one embodiment, the vertically alternating tiers are formed to be different composition insulating materials prior to forming the channel openings.

Further as stated above, processing may occur in forming polysilicon regardless of resulting integrated circuitry construction, and may occur where the resulting construction does not include integrated circuitry. Such a method of forming polysilicon comprises forming a first polysilicon-comprising material over a substrate, with such polysilicon-comprising material comprising at least one of elemental carbon and elemental nitrogen at a total of 0.1 to 20 atomic percent. A second polysilicon-comprising material is formed over the first polysilicon-comprising material, with the second polysilicon-comprising material comprising less, if any, total elemental carbon and elemental nitrogen than does the first polysilicon-comprising material. Any other attribute(s) or aspect(s) as shown and/or described above may be used.

Embodiments of the invention comprise an elevationally-extending string (e.g., 80) of memory cells (e.g, 88) individually comprising a programmable charge storage transistor (e.g., encompassed by materials 50, 44, 42, 40, and 26 in an individual tier) independent of method of manufacture. Such a string comprises vertically-alternating tiers of insulative material (e.g., 28) and control gate material (e.g., 26). A channel pillar (e.g., material 50) extends elevationally through multiple of the vertically-alternating tiers. The channel material comprises radially outer first polysilicon-comprising material (e.g., 36/36a) comprising at least one of elemental carbon and elemental nitrogen at a total of 0.1 to 20 atomic percent. The channel material comprises a second polysilicon-comprising material (e.g., 38/38a) radially inward of the first polysilicon-comprising material. The second polysilicon-comprising material comprises less, if any, total elemental carbon and elemental nitrogen than does the first polysilicon-comprising material. A tunnel insulator (e.g., 44), programmable charge storage material (e.g., 42) and control gate blocking insulator (e.g., 40) are between the channel pillar and the control gate material of individual of the tiers of the control gate material. Any other attribute(s) or aspect(s) as shown and/or described above may be used.

Embodiments of the invention also encompass any electronic component (e.g., a diode, a transistor, a resistor, a transducer, a switch, a fuse, an antifuse, etc.) comprising polysilicon. The polysilicon of such an electronic component comprises a first polysilicon-comprising material proximate a second polysilicon-comprising material. The first polysilicon-comprising material comprises at least one of elemental carbon and elemental nitrogen at a total of 0.1 to 20 atomic percent. The second polysilicon-comprising material comprises less, if any, total elemental carbon and elemental nitrogen that does the first polysilicon-comprising material. In one embodiment, the first and second polysilicon-comprising materials are directly against one another. In one embodiment, the component is a field effect transistor, and the first and second polysilicon-comprising materials comprise a channel region of the field effect transistor. In other example embodiments, the electronic component comprising such polysilicon is any one of a diode, a transistor, a resistor, a transducer, a switch, a fuse, and an antifuse. Any other attribute(s) or aspect(s) as shown and/or described above may be used.

CONCLUSION

In some embodiments, a method of forming an array of elevationally-extending strings of memory cells, where the memory cells individually comprise a programmable charge storage transistor, comprises forming vertically-alternating tiers of different composition materials. Elevationally-extending channel openings are formed into the vertically-alternating tiers. Polysilicon-comprising channel material is formed in the channel openings. The forming of the polysilicon-comprising channel material comprises forming a first polysilicon-comprising material in the channel openings, with the first polysilicon-comprising material comprising at least one of elemental carbon and elemental nitrogen at a total of 0.1 to 20 atomic percent. A second polysilicon-comprising material is formed in the channel openings over the first polysilicon-comprising material. The second polysilicon-comprising material comprises less, if any, total elemental carbon and elemental nitrogen than the first polysilicon-comprising material. Control gate material, control gate blocking insulator, programmable charge storage material, and tunnel insulator are provided operably proximate the channel material.

In some embodiments, a method of forming polysilicon comprises forming a first polysilicon-comprising material over a substrate, with the first polysilicon-comprising material comprising at least one of elemental carbon and elemental nitrogen at a total of 0.1 to 20 atomic percent. A second polysilicon-comprising material is formed over the first polysilicon-comprising material. The second polysilicon-comprising material comprises less, if any, total elemental carbon and elemental nitrogen than the first polysilicon-comprising material.

In some embodiments, an elevationally-extending string of memory cells individually comprising a programmable charge storage transistor comprises vertically-alternating tiers of insulative material and control gate material. A channel pillar extends elevationally through multiple of the vertically-alternating tiers. The channel pillar comprises radially outer first polysilicon-comprising material comprising at least one of elemental carbon and elemental nitrogen at a total of 0.1 to 20 atomic percent. The channel pillar comprises second polysilicon-comprising material radially inward of the first polysilicon-comprising material. The second polysilicon-comprising material comprises less, if any, total elemental carbon and elemental nitrogen than the first polysilicon-comprising material. Tunnel insulator, programmable charge storage material, and control gate blocking insulator are between the channel pillar and the control gate material of individual of the tiers of the control gate material.

In some embodiments, an electronic component comprising polysilicon comprises a first polysilicon-comprising material proximate a second polysilicon-comprising material, with the first polysilicon-comprising material comprising at least one of elemental carbon and elemental nitrogen at a total of 0.1 to 20 atomic percent. The second polysilicon-comprising material comprises less, if any, total elemental carbon and elemental nitrogen than the first polysilicon-comprising material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A field effect transistor comprising:
a conductive gate;
a tunnel insulator adjacent the conductive gate; and
a channel region adjacent the tunnel insulator, the channel region comprising a first polysilicon-comprising material proximate a second polysilicon-comprising material, the first polysilicon-comprising material being directly against the tunnel insulator and comprising at least one of elemental carbon and elemental nitrogen at a total of 0.1 to 20 atomic percent, the second polysilicon-comprising material comprising total elemental carbon and elemental nitrogen that is from zero to less than the total of the at least one of elemental carbon and elemental nitrogen that is in the first polysilicon-comprising material, the first polysilicon-comprising material being thicker than the second polysilicon-comprising material, the first polysilicon-comprising material and the second polysilicon-comprising material having at least 30 percent 111 crystal orientation as measured by electron backscatter diffraction (EBSD).

2. The field effect transistor of claim 1 wherein the first and second polysilicon-comprising materials are directly against one another.

3. The field effect transistor of claim 1 wherein the first polysilicon-comprising material and the second polysilicon-comprising material have at least 50 percent 111 crystal orientation as measured by EBSD.

4. The field effect transistor of claim 1 wherein the first polysilicon-comprising material comprises both elemental carbon and elemental nitrogen.

5. The field effect transistor of claim 4 wherein the total of the elemental carbon and elemental nitrogen in the first polysilicon-comprising material is 0.5 to 2 atomic percent.

6. The field effect transistor of claim 1 wherein the total of the elemental carbon and elemental nitrogen in the second polysilicon-comprising material is zero to 0.001 atomic percent.

7. The field effect transistor of claim 1 wherein the first polysilicon-comprising material comprises only one of elemental carbon and elemental nitrogen.

8. The field effect transistor of claim 7 wherein the first polysilicon-comprising material comprises elemental carbon.

9. The field effect transistor of claim 7 wherein the first polysilicon-comprising material comprises elemental nitrogen.

* * * * *